(12) United States Patent
Gu

(10) Patent No.: US 6,737,914 B2
(45) Date of Patent: May 18, 2004

(54) REMOVING EFFECTS OF GAIN AND PHASE MISMATCH IN A LINEAR AMPLIFICATION WITH NONLINEAR COMPONENTS (LINC) SYSTEM

(75) Inventor: Jian Gu, San Diego, CA (US)

(73) Assignee: 4D Connect, Inc., San Diego, CA (US)

( * ) Notice: Subject to any disclaimer, the term of this patent is extended or adjusted under 35 U.S.C. 154(b) by 0 days.

(21) Appl. No.: 10/061,810

(22) Filed: Jan. 31, 2002

(65) Prior Publication Data

US 2003/0107435 A1 Jun. 12, 2003

Related U.S. Application Data

(60) Provisional application No. 60/340,678, filed on Dec. 7, 2001.

(51) Int. Cl.[7] ................................................ H03F 1/26
(52) U.S. Cl. ......................... 330/2; 330/124 R; 330/149
(58) Field of Search ............................... 330/2, 124 R, 330/149

(56) References Cited

U.S. PATENT DOCUMENTS 5,365,187 A * 11/1994 Hornak et al. .......... 330/149 X
6,054,896 A     4/2000  Wright et al.

OTHER PUBLICATIONS

Chireix, H., "High Power Outphasing Modulation," Proc. IRE, vol. 23, No. 11, Nov. 1935 pp.1360–1392.

Cox, D.C., "Linear Amplification with Nonlinear Components" IEEE Trans. Commun vol. Com–23, Dec. 1974. pp. 1942–1945.

* cited by examiner

Primary Examiner—Steven J. Mottola
(74) Attorney, Agent, or Firm—Blakely, Sokoloff, Taylor & Zafman LLP

(57) ABSTRACT

A method for removing effects of gain and phase mismatch in amplification branches of a linear amplification using nonlinear components (LINC) system. The method includes receiving an input signal, calculating a relative phase and gain difference in the amplification branches, and generating phasing components. The input signal is then controllably separated into a plurality of branch signals of different but constant envelope. The mismatch between branches may cause each branch signal to have a different envelop. The phases of the branch signals are then appropriately adjusted in a certain amount of corresponding phasing components, such that when the branch signals are recombined, the combined signal substantially replicates the input signal.

15 Claims, 5 Drawing Sheets

REMOVING EFFECTS OF GAIN AND PHASE MISMATCH IN A LINEAR AMPLIFICATION WITH NONLINEAR COMPONENTS (LINC) SYSTEM

CROSS REFERENCE TO RELATED APPLICATIONS

This application claims benefit of the priority of U.S. Provisional Application No. 60/340,678, filed Dec. 7, 2001, and entitled "Methods and Apparatus to Remove Effects of Gain and Phase Mismatch for Transmitters using LINC Technology".

BACKGROUND

The present invention relates to a linear amplification with nonlinear components (LINC) system. More particularly, the invention relates to removing effects of gain and phase mismatch in such a LINC system without adjusting its analog circuits.

Many signal processing circuits have a need to maintain known relationships between the signals traversing multiple signal paths. In practice, however, imperfections within a circuit may affect such relationships and adversely impact the performance of the circuit. One example is that of an amplifier employing a linear amplification using nonlinear components (LINC) technique. Recently, this LINC technique has received much attention because the technique is suitable for wireless communication applications.

In a typical LINC amplifier, a signal to be amplified is decomposed into two signals, both having an equal and constant envelope. Baseband in-phase (I) and quadrature (Q) signal modulation of a radio frequency (RF) carrier signal may be used to obtain the two decomposed signals. The decomposed signals are separately amplified by two independent amplification paths with the same gain and delay (phase) then combined to form a linearly amplified signal. The LINC amplifier is attractive because the two decomposed signals to be amplified have a constant envelope that enables the use of efficient nonlinear radio frequency (RF) power amplifiers for amplification. Moreover, the final output may be highly linear and substantially free of intermodulation—a key consideration for bandwidth efficient wireless communications.

However, the promise of LINC amplifiers have yet to be fully realized in part because of the difficulty in developing circuits that maintain phase and gain balance for the two independent amplification paths. For a LINC transmitter, the gain and phase mismatch of the two amplification paths will not only affect its modulation accuracy but also degrade its out-of-band spectrum performance. The out-of-band spectrum performance of a transmitter is measured by the ratio of the maximum out-of-band signal level to the signal level inside the signal bandwidth. Decreasing this ratio results in a higher requirement on the matching condition. For example, it may be desirable to achieve an out-of-band spectrum performance of −65 dBc for adjacent channel coupled power, which, for a fairly simple modulation scheme, requires phase and gain match conditions within 0.5% for signals traversing the different amplification paths. Manufacturing imperfections within the amplification circuits make such balancing requirements difficult to achieve.

A variety of prior art approaches exists to address such circuit imperfections. In one approach, phase and power measurements are made of RF signals and such measurements used to adjust for signal path imbalance. In another prior art approach, a feedback loop is used which requires the sampling and processing of the RF signal to compare with the original baseband signal. This approach typically requires complex stability analysis to handle impedance load variations and other factors. Further, in prior art approaches, adjustments typically involve phase and amplitude corrections along the RF signal paths. However, any adjustment of the gain of an amplification path may also change the phase of the amplification path due to the well-known AM-PM phenomenon. Moreover, phase adjustment by impedance change may also affect the equivalent gain of the amplification path. Therefore, such adjustment processes involve the resulting signal being continuously calibrated and measured until a certain amount of accuracy is achieved. Moreover, gain adjustment to a non-linear amplifier in a deep saturate state is difficult since its output power level is insensitive to its input power level.

SUMMARY

In one aspect, the invention includes a method for removing effects of gain and phase mismatch in amplification branches of a linear amplification using nonlinear components (LINC) system. The method includes receiving an input signal, calculating a relative phase and gain difference in the amplification branches, and generating appropriate phasing components. The input signal is then controllably separated into a plurality of branch signals of different but constant envelope. The mismatch between branches may cause each branch signal to have a different envelope. However, the phases of the branch signals are appropriately adjusted in a certain amount of corresponding phasing components, in consideration of mismatch effect, such that when the branch signals are recombined, the combined signal substantially replicates the input signal.

In another aspect, the invention includes a linear amplification using nonlinear components (LINC) system. The LINC system includes a phasing component generator, a plurality of phase modulators, a plurality of power amplifiers, and a combiner. The phasing component generator is configured to receive an input signal, and operates to control separation of the input signal into a plurality of branch signals by generating phasing components for the phase modulators after calculating a relative phase and gain difference in amplification branches. Each branch includes one phase modulator to phase modulate the branch signal. Each phasing component is then applied to a corresponding phase modulator in the branch. Each branch also includes at least one non-linear power amplifier to amplify the phase modulated branch signal. The magnitude of the resulting output branch signal is constant and modulation independent. The mismatch between branches may cause each branch signal to have a different envelope. The combiner combines the amplified branch signals of different but constant magnitudes such that when the branch signals from the amplification branches are recombined, the combined signal substantially replicates the input signal.

DETAILED DESCRIPTION

In recognition of the above-stated problems associated with conventional designs of phase and gain adjustments for amplifiers employing a linear amplification using nonlinear components (LINC) technique, embodiments for new correction techniques in the LINC system are described. Specifically, the technique removes the effects of gain and phase mismatch of the amplification paths by generating appropriate phasing components for the decomposed signals without changing gain and phase of the amplifiers in the amplification paths. In some embodiments, the appropriate phasing components are generated in a digital format. The techniques involve first calculating the relative phase and gain difference of the amplification paths in the branches by modulating and sending calibration or training signals, and demodulating the training signals using a receiver. A parameter called phase skew ($\Delta$), which results from the gain and phase mismatch conditions and is also a function of the input signal magnitude, is then calculated. The phase skew ($\Delta$) provides the additional adjustment of the phasing components generated for driving the phase modulators in the two amplification paths of a LINC transmitter. When the phase-modulated signals from each path/branch are recombined, the input signal is substantially replicated. Consequently, for purposes of illustration and not for purposes of limitation, the exemplary embodiments of the invention are described in a manner consistent with such use, though clearly the invention is not so limited.

Figure 1:
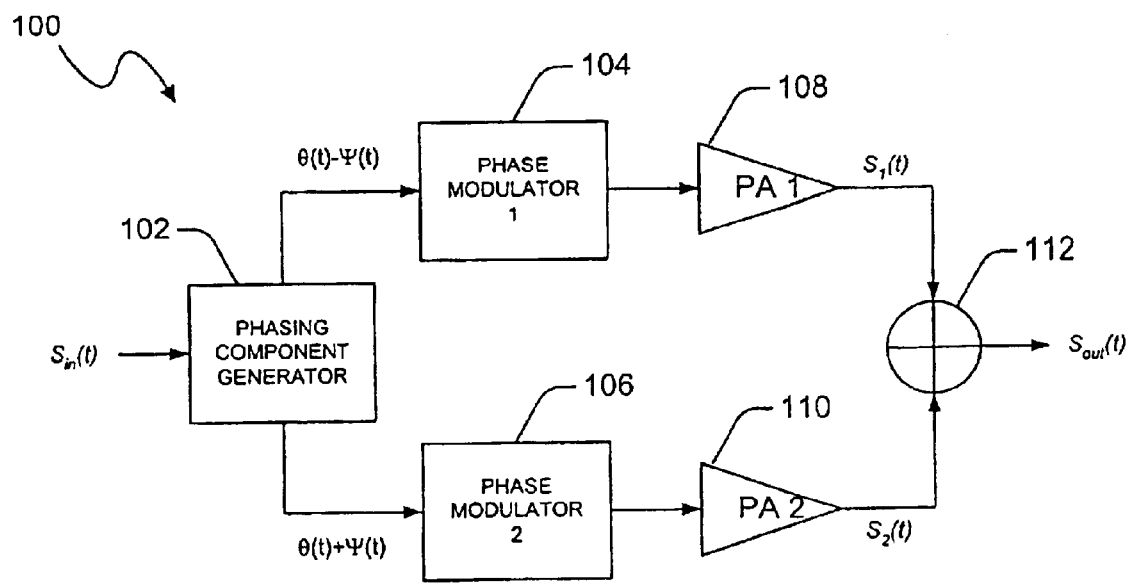
FIG. 1 illustrates a simplified block diagram of one embodiment of a LINC transmitter having two branches.

As explained above, the principle of a linear amplification with nonlinear components (LINC) transmitter is to represent an arbitrary bandpass signal by means of two out-phased constant envelope signals. A simplified block diagram of one embodiment of such a LINC transmitter 100 having two branches is shown in FIG. 1. In the illustrated embodiment, the bandpass signal ($S_{in}(t)$) is separated into two out-phased signals by a phasing component generator 102 and phase modulators 104, 106 in the two branches which may be realized by a quadrature modulator or a phase-locked loop (PLL). The output of the phase modulator 104, 106 is then amplified by a power amplifier 108, 110, which is preferably a nonlinear amplifier working in a deep saturation state to achieve relatively high-power efficiency. The signals are recombined through a combiner 112 before being transmitted.

A complex representation of the desired signal to be transmitted may be written as $$S_{in}(t) = |S_{in}(t)|e^{j\theta(t)},$$

where $$0 \leq |S_{in}(t)| \leq V_m. \quad (1)$$

Figure 2:
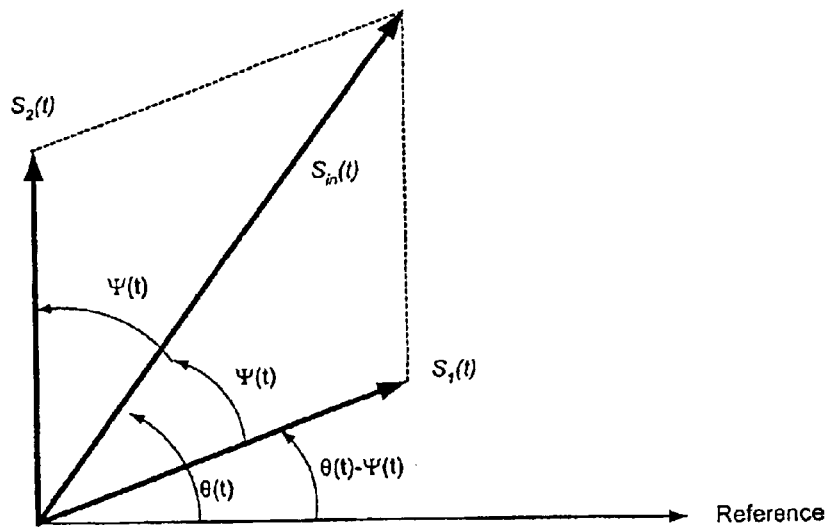
FIG. 2 shows a vector representation of the baseband input signal ($S_{in}(t)$) and branch signals, $S_1(t)$ and $S_2(t)$, having equal magnitude and phase.

This signal may be separated by the phasing component generator and the two following phase modulators into two branch signals with modulated phase and constant amplitudes, as follows:

$$S_1(t) = \frac{1}{2} V_m \cdot e^{j(\theta(t)-\Psi(t))} \text{ and } S_2(t) = \frac{1}{2} V_m \cdot e^{j(\theta(t)-\Psi(t))}, \quad (2)$$

where magnitude related phasing (MRP), $\Psi(t)$, is determined by $$\cos(\Psi(t)) = \frac{|S_{in}(t)|}{V_m} = \frac{e^{-j\Psi(t)}+e^{j\Psi(t)}}{2} \text{ for } |S_{in}(t)| \leq V_m,$$

and $V_m$ is a constant positive real number. Thus, adding the two signals together, $$S_1(t) + S_2(t) =$$

$$\frac{1}{2}V_m \cdot e^{j\theta(t)}\left(e^{-j\Psi(t)}+e^{j\Psi(t)}\right) = V_m \cdot e^{j\theta(t)}\cos(\Psi(t)) = |S_{in}(t)|e^{j\theta(t)} = S_{in}(t),$$

as illustrated in FIG. 2. Note that the relative phase difference between $S_1(t)$ and $S_2(t)$ is two times the MRP ($\Psi(t)$). Furthermore, the MRP determines the magnitude of the combined signal. In equation (2), reference vectors $$A = \frac{1}{2}V_m \cdot e^{j0} \text{ and } B = \frac{1}{2}V_m \cdot e^{j0}$$

may be defined. Each vector accounts for a total gain and delay (phase shift) of a corresponding amplification path. Then, for any given input signal $S_{in}(t)=|S_{in}(t)|e^{j\theta(t)}$ with $|S_{in}(t)| \leq V_m$, $S_{in}(t)$ may be reproduced by applying phasing components $\theta(t)-\Psi(t)$ and $\theta(t)+\Psi(t)$ to the two reference vectors, respectively, which results in two phase-modulated signals, and by combining the two phase modulated signals.

Figure 3:
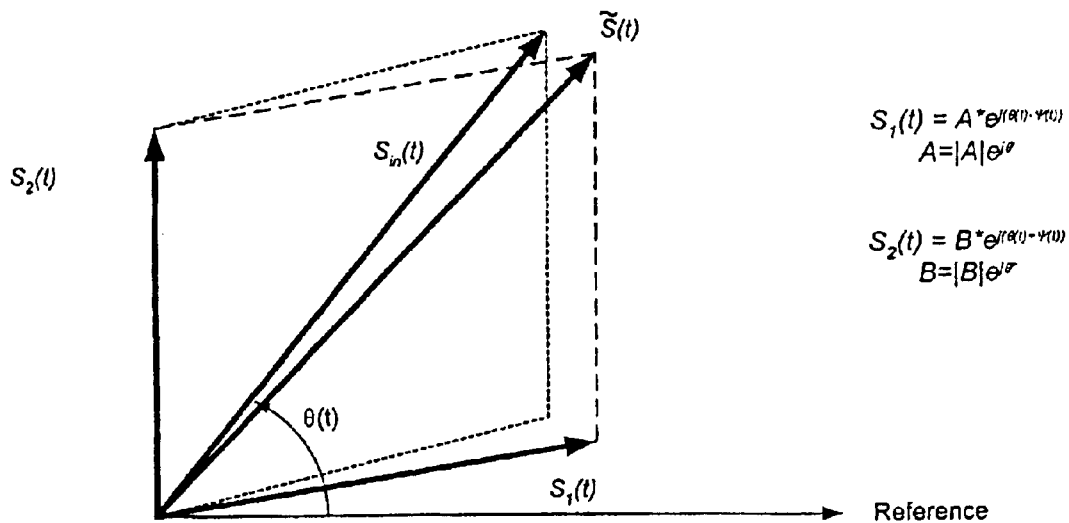
FIG. 3 shows a vector representation of the baseband input signal ($S_{in}(t)$) and branch signals, $S_1(t)$ and $S_2(t)$, having unequal magnitudes and phases.

However, as described above, the derivation is valid only when the power amplifiers in the two branches are balanced, such that the gains and phases (delays) are substantially similar, or equivalently, the reference vectors A and B have the same magnitude and phase. Moreover, these balanced characteristics have to be maintained with variation of temperature and transition of channels. In practice, however, these conditions are difficult to achieve. For example, as illustrated in FIG. 3, if the reference vectors A and B have different magnitude and phase due to gain and phase mismatch between the two branches, the combined resultant signal produces $\tilde{S}(t)$, instead of the desired signal $S_{in}(t)$. Therefore, with $S_1(t)=A\cdot e^{j(\theta(t)-\Psi(t))}$ and $S_2(t)=B\cdot e^{j(\theta(t)+\Psi(t))}$, the combined resultant signal is $$\tilde{S}(t) = S_1(t)+S_2(t) = A\cdot e^{j(\theta(t)-\Psi(t))}+B\cdot e^{j(\theta(t)+\Psi(t))} \quad (3)$$

Figure 4:
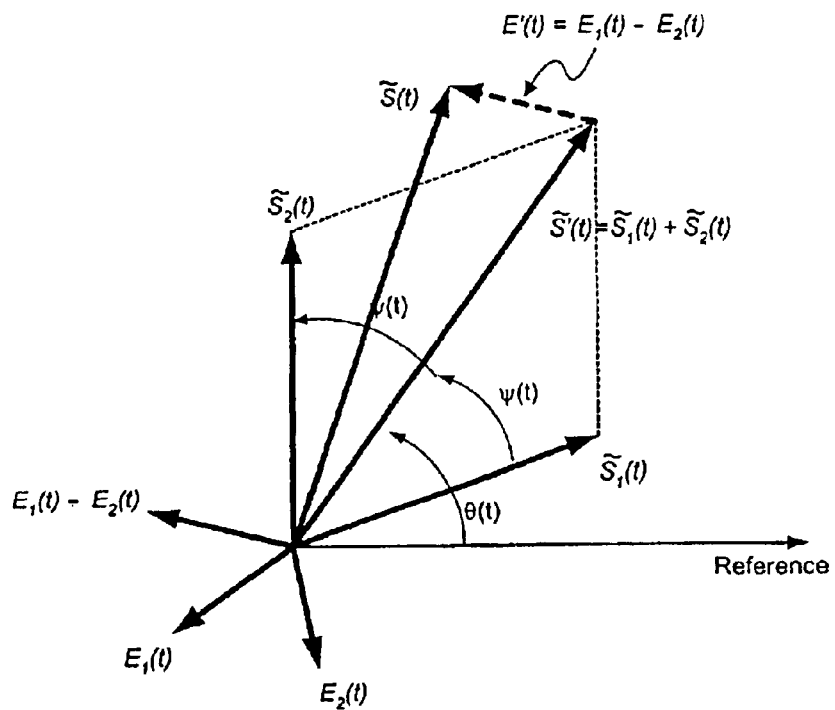
FIG. 4 illustrates a vector relationship between vectors $\tilde{S}_1(t)$, $\tilde{S}_2(t)$, $E_1(t)$, and $E_2(t)$.

By rearranging, the combined resultant signal may be expressed as $$\tilde{S}(t) = \frac{1}{2}(A+B)\cdot e^{j\theta(t)}\left(e^{-j\Psi(t)}+e^{j\Psi(t)}\right) + \frac{1}{2}(A-B)\cdot e^{j\theta(t)}\left(e^{-j\Psi(t)}-e^{j\Psi(t)}\right) \quad (4)$$

$$= \frac{A+B}{2}(e^{j\theta(t)-j\Psi(t)}+e^{j\theta(t)+j\Psi(t)}) + \frac{A-B}{2}(e^{j\theta(t)-j\Psi(t)}-e^{j\theta(t)+j\Psi(t)}),$$

$$= \tilde{S}_1(t) + \tilde{S}_2(t) + E_1(t) - E_2(t)$$

where $$\tilde{S}_1(t) = \frac{C}{2}e^{j(\theta(t)-\Psi(t))}, \tilde{S}_2(t) = \frac{C}{2}e^{j(\theta(t)+\Psi(t))}, E_1(t) = \frac{D}{2}e^{j(\theta(t)-\Psi(t))}$$

and $$E_2(t) = \frac{D}{2} e^{j(\theta(t)+\Psi(t))},$$

with C=A+B and D=A−B. Thus, $\tilde{S}_1(t)$ and $\tilde{S}_2(t)$ behave like a pair of well-matched signals that generates a desired signal (i.e., $\tilde{S}'(t)=\tilde{S}_1(t)+\tilde{S}_2(t)$) with phase $\theta(t)$ and a varied magnitude depending on $\Psi(t)$. Furthermore, $E_1(t)$ and $E_2(t)$ generate a varying error component (i.e., $E'(t)=E_1(t)-E_2(t)$) depending on $\Psi(t)$. The relationship between these vectors is illustrated in FIG. 4.

The effects of the phase and gain mismatch of the components in the branches of the LINC transmitters may be substantially removed by solving the above-discussed problem in a reverse way. This process is equivalent to assuming that the desired signal is $\tilde{S}(t)$, and solving the relationships between vectors $\tilde{S}_1(t)$, $\tilde{S}_2(t)$, $E_1(t)$, and $E_2(t)$, after reference vectors A and B have been determined by a calibration process. It is desirable to have such a process that produces a simple phase adjustment in the reference vectors in addition to the MRP and input signal phase, such that the combined resultant signal becomes substantially similar to the desired signal.

In the process of solving for the relationships among the vectors, let $\theta(t)=0$ and $\tilde{S}(t)=S(t)$, without loss of generality. Then, from equation (4), the desired signal S(t) may be expressed as $$S(t) = \frac{A+B}{2} \cdot (e^{-j\Psi(t)} + e^{j\Psi(t)}) + \frac{A-B}{2} \cdot (e^{-j\Psi(t)} - e^{j\Psi(t)}). \quad (5)$$

Since $$\cos(\Psi(t)) = \frac{(e^{-j\Psi(t)} + e^{j\Psi(t)})}{2} \text{ and } \sin(\Psi(t)) \frac{e^{j\Psi(t)} - e^{-j\Psi(t)}}{2j},$$

equation (5) may be alternatively expressed as $$S(t) = (A+B)\cdot\cos(\Psi(t)) - j\cdot(A-B)\sin(\Psi(t)) \quad (6)$$
$$= (A+B)\cdot\cos(\Psi(t)) + j\cdot(B-A)\sin(\Psi(t)).$$

However, equation (6) defines the trajectory of S(t) as a function of $\Psi(t)$ as part of a generalized Elliptic curve. This curve may be formulated as $(A+B)\cos\Phi+j(B-A)\sin\Phi$ with a parameter $\Phi$ taken over $$0 \le \varphi \le \frac{\pi}{2}.$$

Figure 5:
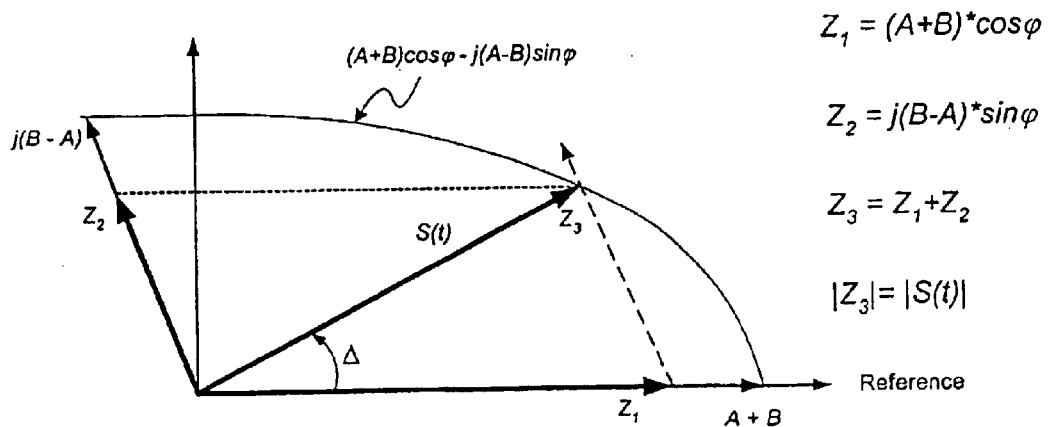
FIG. 5 show a generalized Elliptic curve in terms of two complex numbers (vectors) which are proportional to a sum vector A+B and an error vector j(B−A).
Figure 6:
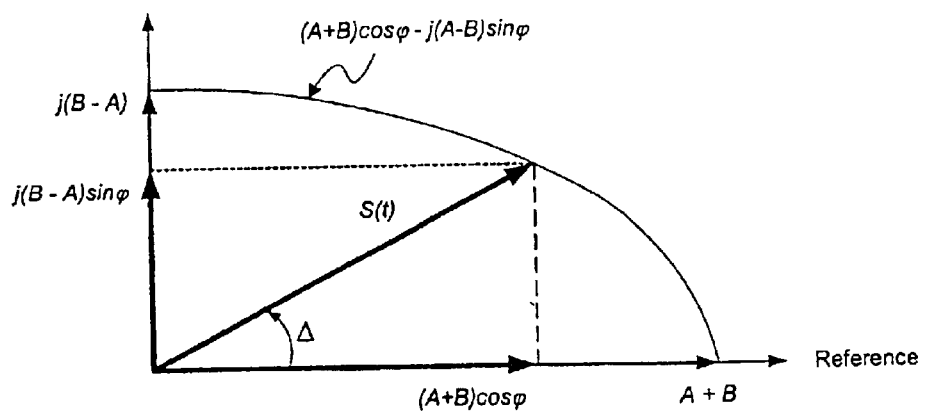
FIG. 6 shows an Elliptic curve with reference vectors A and B having a same phase.

The generalized Elliptic curve is a trajectory of a vector, which is a sum of two vectors that are proportional to a sum vector (A+B) and an error vector j(B−A), as shown in FIG. 5. A special case of the generalized Elliptic curve is shown in FIG. 6, with A and B having the same phase. This curve represents an Elliptic curve in a complex plane with its long axis (A+B) and short axis j(B−A). Note that A+B and j(B−A) are orthogonal in the special case of FIG. 6. For each point on the (generalized) Elliptic curve, there is a corresponding $\Phi$. Given $\Phi$, or equivalently a point on the curve, phase skew ($\Delta$) which is a phase difference between a vector ending at the point on the curve and the sum vector (A+B), may be determined.

Figure 7:
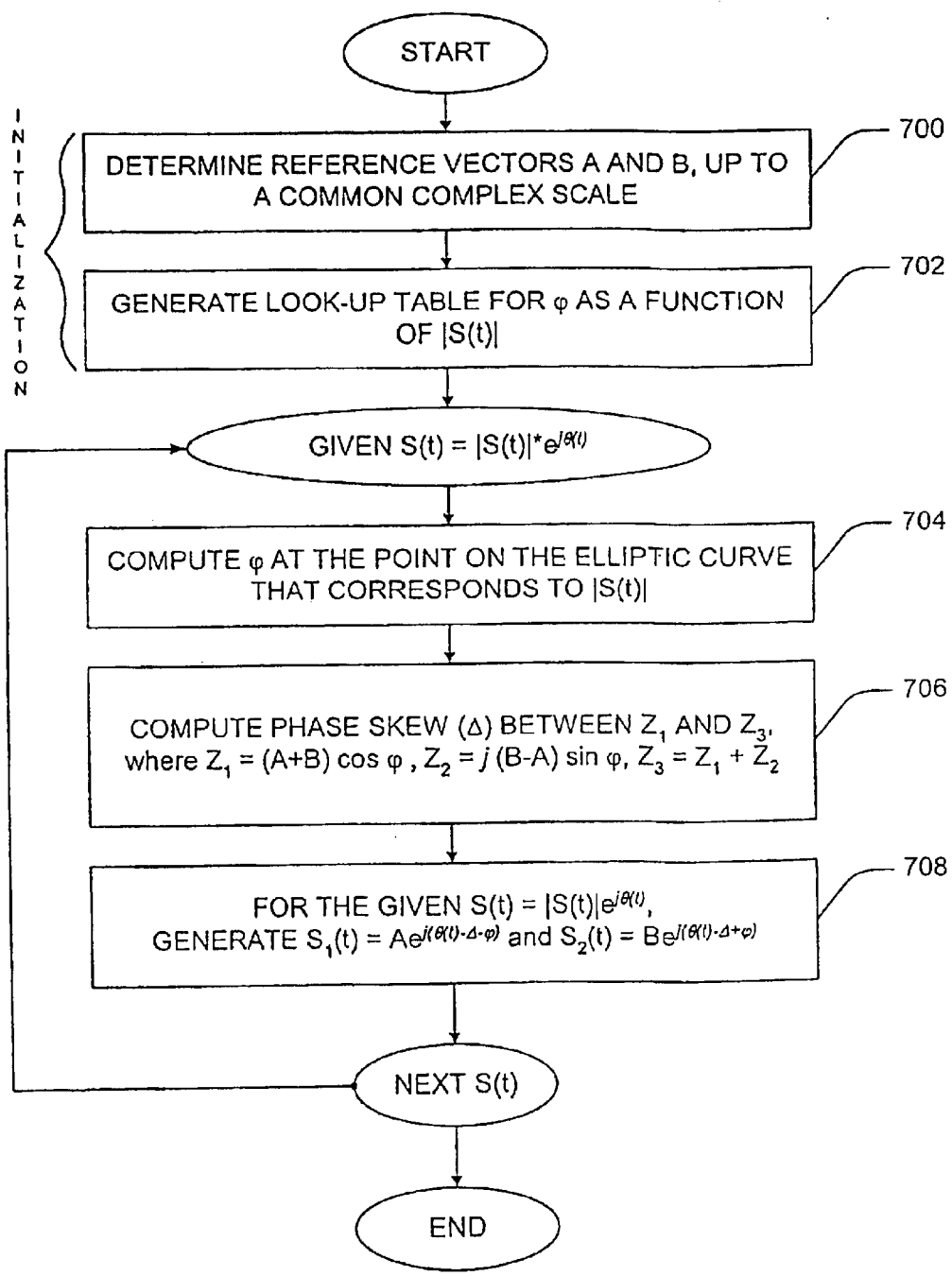
FIG. 7 summarizes an embodiment of a new technique for removing effect of gain and phase mismatch in a flowchart.

FIG. 7 summarizes an embodiment of the new technique for removing the effect of gain and phase mismatch, in a flowchart. As mentioned above, the goal of the technique then is to control the separation of the input signal into a number of branch signals of different but constant magnitudes such that only phases of the branch signals (e.g., $S_1$ and $S_2$) need to be appropriately adjusted. Thus, this process accounts for the signal path imbalance in the branches so that the combined signal substantially replicates the desired signal.

The technique includes determining the amplitudes and phase difference of the branch signals when no phase shift is applied to the branches (i.e., the reference vectors A and B), up to a common complex scale at an initialization stage 700. Determination of the reference vectors A and B involves generating two calibration signals from the transmitter, and demodulating the signals in the receiver. Signals $S_1(t)=A$ and $S_2(t)=Be^{jx}$ are initially generated by applying appropriate phase to the phase modulators so that the received signal $R_1$ is equal to $G(S_1(t)+S_2(t))=G(A+Be^{jx})$. Signals $S_1(t)=A$ and $S_2(t)=-Be^{jx}$ are then generated by applying appropriate phase to the phase modulators so that the received signal $R_2$ is equal to $G(S_1(t)+S_2(t))=G(A-Be^{jx})$. The term G is a complex constant, which may be removed or scaled to an appropriate value corresponding to the transmission power and receiver gain. Thus, $R_1+R_2=2G\cdot A$ and $R_1-R_2=2G\cdot B\cdot e^{jx}$. The parameter X may be chosen as $\pi/2$ to get a similar received signal level for the receiver such that the same automatic gain control (AGC) gain setting may be used for the receiver during demodulation of both calibration signals. This assumes that A and B have different magnitude and phase but are close to each other. Note that after the relative phase difference between A and B is determined, two reference vectors with the same phase may be generated by applying the phase difference to A or B (or equivalently, by introducing the phase offset to the corresponding phase modulator). Therefore, it may be assumed that the two reference vectors always have substantially similar phase.

To construct the desired signal S(t), up to a constant complex scale, a point on the Elliptic curve corresponding to a vector having the same magnitude as S(t) is obtained. In FIG. 5 or 6, a point on the curve that corresponds to the vector having the magnitude of $Z_3$ (i.e., $|Z_3|=|S(t)|$) is obtained. Thus, given the magnitude of the desired transmission signal $|S(t)|=|(A+B)\cos\Phi+j(B-A)\cdot\sin\Phi|$, $\Phi$ at the point on the curve that corresponds to the vector with a magnitude $|S(t)|$ is determined, at 704. In practice, this may be done either by search or by looking up a table that is generated at 702.

In cases where such $\Phi$ cannot be found, S(t) may be approximated. The signal S(t) may be approximated as $V_{min}\cdot e^{j\theta}$ if $|S(t)|$ is less than $|(A+B)\cdot\cos\Phi+j(B-A)\cdot\sin\Phi|$ for any $\Phi$, where $$V_{min} = \min_{0 \le \varphi \le \pi/2}\{|(A+B)\cdot\cos\varphi + j(B-A)\cdot\sin\varphi|\}.$$

Otherwise, the signal S(t) may be approximated as $V_{max}\cdot e^{j\theta}$ if $|S(t)|$ is greater than $|(A+B)\cdot\cos\Phi+j(B-A)\cdot\sin\Phi|$ for any $\Phi$, where $$V_{max} = \max_{0 \le \varphi \le \pi/2}\{|(A+B)\cdot\cos\varphi + j(B-A)\cdot\sin\varphi|\}.$$

Therefore, in the above cases, the corresponding $\Phi$ is the one achieving $V_{min}$ or $V_{max}$.

After $\Phi$ is found, the parameters $Z_1$ and $Z_2$ may be computed as $Z_1=(B+A)\cos\Phi$ and $Z_2=j(B-A)\sin\Phi$. The relative phase difference $\Delta$ (i.e., phase skew) between a vector ending at the point on the curve (i.e., $Z_3=Z_1+Z_2$) and the sum vector (A+B) (i.e., $Z_1$) is then determined, at 706.

Note that $|Z_1+Z_2|=|S(t)|$. In a special case where A and B have no phase difference, $\Delta$ is determined as illustrated in FIG. 6. In some embodiments, the phase skew ($\Delta$) may be calculated beforehand in the initialization stage 702 for each possible $\Phi$, after A and B have been determined up to a common complex scale.

Once $\Phi$ and $\Delta$ are determined, appropriate phases may then be applied to the phase modulator to generate $S_1(t) = A \cdot e^{j(\Theta(t)-\Delta-\Phi)}$ and $S_2(t) = B \cdot e^{j(\Theta(t)-\Delta+\Phi)}$, at 708, where $\Theta(t)$ is the phase of the signal $S(t)$. The desired transmission signal $S(t) = S_1(t) + S_2(t)$ may then be obtained by combining $S_1(t)$ and $S_2(t)$.

If $$|S(t)| < V_{min} = \min_{0 \leq \varphi \leq \pi/2} \{|(A+B) \cdot \cos\varphi + j(B-A) \cdot \sin\varphi|\},$$

then $S(t) = |S(t)|e^{j\Theta}$ may be approximated by $V_{min} \cdot e^{j\Theta}$ with the corresponding $\Phi$ achieving the minimum. However, if $$|S(t)| > V_{max} = \max_{0 \leq \varphi \leq \pi/2} \{|(A+B) \cdot \cos\varphi + j(B-A) \cdot \sin\varphi|\},$$

then $S(t) = |S(t)|e^{j\Theta}$ may be approximated by $V_{max} \cdot e^{j\Theta}$ with the corresponding $\Phi$ achieving the maximum. Accordingly, these approximations provide an effect similar to quantization noises. The circle of radius $V_{min}$ is called a "dead circle" because the signal points within the circle are unable to be represented correctly by applying phasing values to the two constant magnitude vectors A and B without distortion (see FIG. 9A). The circle of radius $V_{max}$ is called a "clipping circle" because the signal points outside the circle are unable to be represented correctly by changing the phases of the two constant magnitude vectors A and B without distortion. Thus, the signal points may be clipped to the signal points of the magnitude $V_{max}$.

The approximations made to the signal points inside the dead circle or outside the clipping circle may be improved upon by smoothing the phase trajectory of a sequence of such signal points by forcing the signal points to travel along the curve of the dead circle with continuous phase (monotonically) between the beginning point and the ending point of the sequence. This enables the resulting spectrum of the signal may be improved. The beginning point goes into (comes out of) the dead circle (the clipping circle) and the ending point, which is the earliest one after the beginning point, comes out of (goes into) the dead circle (the clipping circle).

Since many modulation schemes do not use signal points near the null, the new mismatch effect removal technique described above may replicate the desired transmission signal for these modulation schemes, even with a certain amount of gain and phase mismatch between the two branches. Examples of such schemes include $$\frac{\pi}{4}$$

shifted quadrature phase shift keying (QPSK), Offset QPSK (OQPSK) and Offset quadrature amplitude modulation (OQAM). For other modulations schemes, the new technique provides a good approximation for any two-branch LINC transmitters to generate desired transmission signals with improved results in both modulation accuracy and out-of-band spectrum performances.

Figure 8:
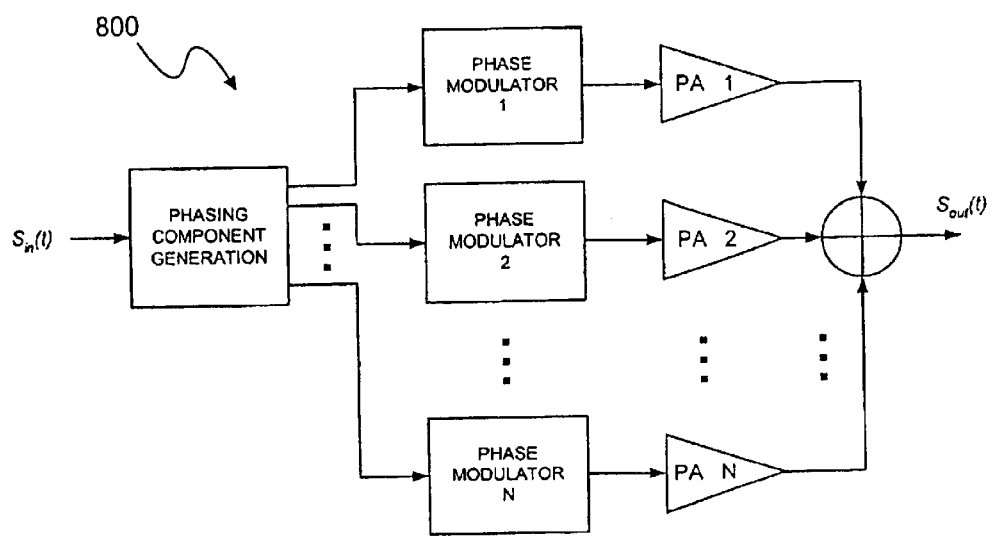
FIG. 8 shows one embodiment of a vector LINC transmitter having N branches.

To provide a LINC transmitter substantially free of dead circles, a vector LINC transmitter having at least three branches may need to be introduced. FIG. 8 shows one embodiment of such a vector LINC transmitter 800 with N branches. For example, vectors $S_1$, $S_2$, and $S_3$ with appropriate phases may represent any signal within a circle of radius $V_m$, and as long as magnitudes of the three vectors can form three sides of a non-trivial triangle (i.e., a sum of any two magnitudes is larger than the remaining one). However, the transmitter may need more processing power for the phasing component generation block than that having only two branches.

Figure 9A:
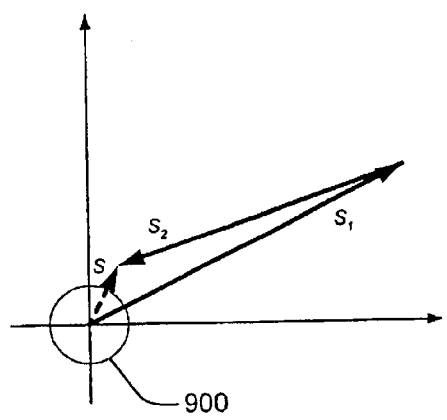
FIG. 9A shows a dead circle in a LINC transmitter with two branches.
Figure 9B:
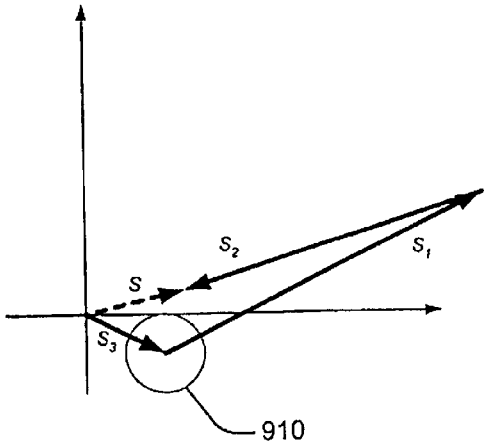
FIG. 9B shows a dead circle, given a fixed third vector, in a LINC transmitter with three branches.

There are several ways to synthesize the desired transmission signal in a LINC transmitter having three branches (with three constant magnitude vectors, $S_1$, $S_2$, and $S_3$). A third branch with a vector $S_3$ whose magnitude is larger than the radius of the dead circle of a two-branch LINC transmitter (with $S_1$ and $S_2$), is introduced. A dead circle 900 is shown in FIG. 9A without $S_3$. FIG. 9B shows a dead circle 910 for $S_1$ and $S_2$ (i.e., set of signal points that cannot be represented by $S_1$ and $S_2$) with a fixed $S_3$. The dead circle 910 is away from the null. The introduction of this vector ($S_3$) may move the dead circle away from the null position so that the desired signal points near null may be represented by three vectors $S_1$, $S_2$, and $S_3$. By changing the phase of $S_3$ accordingly, a signal point in a complex plane may be represented as long as the magnitude of the signal point is less than $V_m$. The term $V_m$ represents the magnitude of the sum of three reference vectors for $S_1$, $S_2$, and $S_3$. Thus, if the desired transmission signal $S=|S|e^{j\Theta}$ is inside a dead circle centered at null, which occurs when only $S_1$ and $S_2$ may be used to represent signal points, then, in one embodiment, by letting $S_3=|S_3|e^{j(\pi+\Theta)}$, with $|S_3|$ larger than the radius of the dead circle, $S-S_3$ is outside the dead circle. Instead of synthesizing $S=|S|e^{j\Theta}$, $S_1$ and $S_2$ are then used to synthesize $S-S_3$ as in the aforementioned case of a two-branch LINC transmitter. Therefore, the synthesis of the final transmission signal may be described as $S_1+S_2=S-S_3$ or $S=S_1+S_2+S_3$ by combining the three phase-modulated signals.

There has been disclosed herein embodiments for removing effects of gain and phase mismatch in a LINC system. The mismatch effect removal techniques involve calibrating and measuring the phase and gain mismatch of the branches of the LINC transmitter, and correspondingly adjusting the parameters during the separation of the input signal. For a two-branch LINC transmitter, gain and phase mismatch of the two amplification paths (or equivalently, the two reference vectors) may cause the signal to fall inside a dead circle where signal points may only be approximated. The limit for the radius of such a dead circle may depend on modulation schemes. Thus, when the signals from each branch are recombined, the input signal is substantially replicated, as long as the dead circle is small enough for the given modulation scheme. For a three-branch LINC transmitter, the dead circle may be avoided without regard to the size of the mismatches between branches. The final combined signal may then be replicated at a price of increased complexity.

While specific embodiments of the invention have been illustrated and described, such descriptions have been for purposes of illustration only and not by way of limitation. Accordingly, throughout this detailed description, for the purposes of explanation, numerous specific details were set forth in order to provide a thorough understanding of the present invention. It will be apparent, however, to one skilled in the art that the embodiments may be practiced without some of these specific details. In other instances, well-known structures and functions were not described in elaborate detail in order to avoid obscuring the subject matter of the present invention. Accordingly, the scope and spirit of the invention should be judged in terms of the claims which follow.

What is claimed is:

1. A method for removing effects of gain and phase mismatch in amplification branches of a linear amplification using nonlinear components (LINC) system, comprising:

receiving calibration signals;

calculating a relative phase and gain difference in the amplification branches, generating a look-up table for phasing component generation;

receiving an input signal;

generating phasing components; and controlling separation of the input signal into a plurality of branch signals of different but constant envelopes by appropriately applying the phasing components to the amplification branches, such that when the branch signals are recombined, the combined signal substantially replicates the input signal.

2. The method of claim 1, wherein said calculating a relative phase and gain difference includes modulating and sending two calibration signals and demodulating the signals using a receiver.

3. The method of claim 2, wherein said modulating and sending two calibration signals and demodulating the signals includes:

generating two sets of branch signals, the first set of branch signals $S_1(t)=A$ and $S_2(t)=Be^{jx}$ forming the first transmission signal and the second set of branch signals $S_1(t)=A$ and $S^2(t)=-Be^{jx}$ forming the second transmission signal, where A and B are the reference vectors and X can be any constant selected in the modulation process; and, using a receiver to demodulate the first received signal $R_1=G(A+Be^{jx})$ and the second received signal $R_2=G(A-Be^{jx})$ and determine A and B up to a constant complex scale by processing the two received signals with $(R_7+R_2)/2$ and $(R_1-R_2)/(2e^{jx})$, where G is a complex number representing the gain or attenuation of the receiving path.

4. The method of claim 1, wherein said generating a look-up table for phasing component generation includes configuring a generalized elliptic curve based on the calculated reference vectors A and B and establishing one-to-one mapping between the points on the curve and possible values of the input signal's magnitude.

5. The method of claim 1 wherein said generating phasing components includes obtaining a point on the generalized elliptic curve corresponding to a vector having same magnitude as the input signal.

6. The method of claim 5, wherein said obtaining a point on the elliptic curve includes searching for an appropriate value for $\Phi$ such that $|S(t)|=|(A+B)\cdot\cos\Phi+j(B-A)\cdot\sin\Phi|$, where $|\cdot|$ stands for the magnitude of the argument, S(t) is the input signal, and A and B are the reference vectors.

7. The method of claim 4, wherein said generating a look-up table for phasing component generation includes tabulating the parameter $\Phi$ as a function of any possible values of the input signal's magnitude $|S(t)|$, such that $|S(t)|=|(A+B)\cdot\cos\Phi+j(B-A)\cdot\sin\Phi|$.

8. The method of claim 5, wherein said obtaining a point on the elliptic curve includes searching the lookup table for the $\Phi$ related to the point on the elliptic curve that corresponds to a vector having the same magnitude of the input signal.

9. The method of claim 4, wherein said generating a lookup table for phasing component generation includes calculating a phase skew which is the phase difference between $Z_3$ and $Z_1$, where $Z_3=\cos\Phi+j(B-A)\cdot\sin\Phi$ is a point on the generalized elliptic curve corresponding to a parameter $\Phi$ and $Z_1=(B+A)$, and tabulating the phase skew $\Delta$ as a function of any possible values of $\Phi$ or, equivalently, any possible values of the input signal's magnitude $|S(t)|$.

10. The method of claim 1 wherein said generating phasing components includes searching the look-up table for the corresponding $\Phi$ and $\Delta$ given an input signal's magnitude $|S(t)|$.

11. The method of claim 1, wherein said controlling separation of the input signal into a plurality of branch signals includes applying appropriate phasing components $\theta(t)-\Delta-\Phi$ and $\theta(t)-\Delta+\Phi$ to phase modulators in amplification branches to generate at least following branch signals $S_1(t)=A\cdot e^{j(\theta(t)-\Delta-\Phi)}$ and $S_2(t)=A\cdot e^{j(\theta(t)-\Delta+\Phi)}$, where $S_1(t)$ is a first branch signal and $S_2(t)$ is a second branch signal, A and B are reference vectors, $\theta(t)$ is phase of the input signal $S(t)=|S(t)|e^{j\theta(t)}$, $\Delta$ is the corresponding phase skew, $\Delta$ and $\Phi$ are associated with a point on the generalized elliptic curve that relates a vector having the same magnitude as the input signal.

12. The method of claim 11, wherein said controlling separation of the input signal into a plurality of branch signals includes approximating $S(t)=|S(t)|e^{j\theta}$ by $V_{min}\cdot e^{j\theta}$ with a corresponding $\Phi$ achieving the minimum when $$|S(t)| < V_{min} = \min_{0\leq\varphi\leq\pi/2}\{|(A+B)\cdot\cos\varphi+j(B-A)\cdot\sin\varphi|\},$$

where $V_{min}$ defines the radius of a dead circle within which an input signal may only be approximated with a two-branch LINC system with branch mismatches.

13. The method of claim 12, where said controlling separation of the input signal into a plurality of branch signals includes providing at least three branch signals to avoid the dead circle.

14. The method of claim 13, where said providing at least three branch signals includes providing a third branch signal with a vector whose magnitude is larger than the radius of the dead circle.

15. The method of claim 14, where said providing a third branch signal moves the dead circle away from a null position by forming a new input signal with magnitude larger than the radius of the dead circle.

* * * * *